US009372239B2

(12) United States Patent
Iwase

(10) Patent No.: US 9,372,239 B2
(45) Date of Patent: Jun. 21, 2016

(54) SEALED BATTERY MANUFACTURING METHOD AND INSPECTION DEVICE

(71) Applicant: Kosuke Iwase, Nagoya (JP)

(72) Inventor: Kosuke Iwase, Nagoya (JP)

(73) Assignee: TOYOTA JIDOSHA KABUSHIKI KAISHA, Aichi-ken (JP)

(*) Notice: Subject to any disclaimer, the term of this patent is extended or adjusted under 35 U.S.C. 154(b) by 0 days.

(21) Appl. No.: 14/429,810

(22) PCT Filed: Aug. 7, 2013

(86) PCT No.: PCT/JP2013/004780
§ 371 (c)(1),
(2) Date: Mar. 20, 2015

(87) PCT Pub. No.: WO2014/049933
PCT Pub. Date: Apr. 3, 2014

(65) Prior Publication Data
US 2015/0234012 A1    Aug. 20, 2015

(30) Foreign Application Priority Data

Sep. 26, 2012  (JP) .................................. 2012-212596

(51) Int. Cl.
G01N 27/416 (2006.01)
G01R 31/36 (2006.01)

(52) U.S. Cl.
CPC .......... G01R 31/3641 (2013.01); G01R 31/362 (2013.01)

(58) Field of Classification Search
USPC ......................................................... 324/426
See application file for complete search history.

(56) References Cited

U.S. PATENT DOCUMENTS

| | | | | |
|---|---|---|---|---|
| 6,424,158 B2* | 7/2002 | Klang | ............................ | 324/433 |
| 6,469,471 B1* | 10/2002 | Anbuky et al. | ............... | 320/118 |
| 2005/0118497 A1* | 6/2005 | Breen | ............................. | 429/93 |
| 2005/0242820 A1* | 11/2005 | Kume et al. | ................... | 324/426 |
| 2011/0068800 A1 | 3/2011 | Nishino et al. | | |
| 2013/0141107 A1* | 6/2013 | Yuasa | ........................... | 324/426 |

FOREIGN PATENT DOCUMENTS

| | | |
|---|---|---|
| JP | 62126543 A | 6/1987 |
| JP | 2000088933 A | 3/2000 |
| JP | 2004288515 A | 10/2004 |
| JP | 2007115478 A | 5/2007 |
| JP | 2009-252644 A | 10/2009 |
| WO | 2006/075740 A1 | 7/2006 |
| WO | 2010/082502 A1 | 7/2010 |

* cited by examiner

Primary Examiner — Yalkew Fantu
(74) Attorney, Agent, or Firm — Sughrue Mion, PLLC; Richard C. Turner

(57) ABSTRACT

A method for manufacturing a sealed battery (10) includes the steps of: measuring a voltage of the sealed battery (10) when a charging current of a predetermined value or more is caused to flow to the sealed battery (10) for a predetermined time after initial charging of the sealed battery (10); and determining whether a battery case (11) of the sealed battery (10) is damaged or not based on a change in the measured voltage. When an inclination of the voltage increases in a time change of the measured voltage, it may be determined that a recess (12) is present in the battery case (11) of the sealed battery (10).

10 Claims, 7 Drawing Sheets

| VALUE OF CHARGING CURRENT | 10C | 15C | 20C | 25C |
|---|---|---|---|---|
| DEPTH OF RECESS \ SUPPLY TIME | 0.5s | 0.5s | 0.5s | 0.5s |
| 0.000mm | × | × | × | × |
| 0.025mm | × | × | × | × |
| 0.050mm | × | × | ○ | ○ |
| 0.075mm | × | × | ○ | ○ |
| 0.100mm | × | × | ○ | ○ |
| 0.125mm | × | × | ○ | ○ |
| 0.150mm | × | × | ○ | ○ |
| 0.175mm | ○ | ○ | ○ | ○ |
| 0.200mm | ○ | ○ | ○ | ○ |

Fig. 4

| VALUE OF CHARGING CURRENT | 20C | 20C | 20C | 20C |
|---|---|---|---|---|
| DEPTH OF RECESS \ SUPPLY TIME | 0.1s | 0.5s | 1.0s | 2.0s |
| 0.000mm | × | × | × | × |
| 0.025mm | × | × | × | × |
| 0.050mm | × | ○ | ○ | × |
| 0.075mm | × | ○ | ○ | ○ |
| 0.100mm | × | ○ | ○ | ○ |
| 0.125mm | × | ○ | ○ | ○ |
| 0.150mm | × | ○ | ○ | ○ |
| 0.175mm | × | ○ | ○ | ○ |
| 0.200mm | × | ○ | ○ | ○ |

Fig. 5

| DEPTH OF RECESS/mm | 5Ah BATTERY | 25Ah BATTERY |
|---|---|---|
| 0.000 | × | × |
| 0.025 | × | × |
| 0.050 | ○ | ○ |
| 0.075 | ○ | ○ |
| 0.100 | ○ | ○ |
| 0.125 | ○ | ○ |
| 0.150 | ○ | ○ |
| 0.175 | ○ | ○ |
| 0.200 | ○ | ○ |

Fig. 6

SEALED BATTERY MANUFACTURING METHOD AND INSPECTION DEVICE

CROSS REFERENCE TO RELATED APPLICATIONS

This application is a National Stage of International Application No. PCT/JP2013/004780 filed Aug. 7, 2013, claiming priority based on Japanese Patent Application No. 2012-212596 filed Sep. 26, 2012, the contents of all of which are incorporated herein by reference in their entirety.

TECHNICAL FIELD

The present invention relates to a sealed battery manufacturing method and an inspection device which are capable of accurately discriminating whether a battery case of a sealed battery is damaged or not.

BACKGROUND ART

Damage to a battery case of a sealed battery has a large effect on the battery performance. For this reason, various methods for inspecting battery cases in the battery manufacturing process have been proposed. For example, an inspection method is known in which an alternating current is caused to flow through a primary coil of a probe, which is located close to the surface of a battery case, and the battery case and the probe are then moved relative to each other, to thereby detect a damaged part on the surface of the battery case based on a change in one of the measured values of an impedance of an induced current generated on the surface of the battery case and a voltage induced in a secondary coil (see Patent Literature 1).

CITATION LIST

Patent Literature

[Patent Literature 1] Japanese Unexamined Patent Application Publication No. 2009-252644

SUMMARY OF INVENTION

Technical Problem

However, the above-mentioned inspection method disclosed in Patent Literature 1 requires a special measuring device, which may result in a complicated manufacturing process.

The present invention has been made to solve the above-mentioned problem, and therefore a main object of the present invention is to provide a sealed battery manufacturing method and an inspection method which are capable of accurately determining damage to a battery case of a sealed battery by a simple technique.

Solution to Problem

To achieve the above-mentioned object, an aspect of the present invention is a sealed battery manufacturing method including the steps of: measuring a voltage of the sealed battery when a charging current of a predetermined value or more is caused to flow to the sealed battery for a predetermined time after initial charging of the sealed battery; and determining whether damage is present or not in a battery case of the sealed battery based on a change in the measured voltage.

In this aspect, a determination as to whether or not a recess is present in the battery case of the sealed battery may be made based on a change in the measured voltage.

In this aspect, when an inclination of the voltage increases in a time change of the measured voltage, it may be determined that a recess is present in the battery case of the sealed battery.

In this aspect, when the inclination of the voltage during a first measurement period is larger than the inclination of the voltage during a second measurement period subsequent to the first measurement period in the time change of the measured voltage, it may be determined that a recess is present in the battery case of the sealed battery.

In this aspect, the voltage of the sealed battery may be measured when a charging current of 20 to 25 C is caused to flow to the sealed battery for 0.5 to 1.0 seconds after the initial charging.

In this aspect, the voltage of the sealed battery may be measured when a charging current of 20 C is caused to flow to the sealed battery for 0.5 seconds after the initial charging.

In this aspect, when the inclination of the voltage during a measurement period of 0.3 to 0.5 seconds is larger than the inclination of the voltage during a measurement period of 0.0 to 0.3 seconds in the time change of the measured voltage, it may be determined that a recess is present in the battery case of the sealed battery.

In this aspect, the sealed battery may be a rectangular lithium ion battery.

To achieve the above-mentioned object, another aspect of the present invention may be an inspection device including: measurement means for measuring a voltage of a sealed battery when a charging current of a predetermined value or more is caused to flow to the sealed battery for a predetermined time after initial charging of the sealed battery; and determination means for determining whether damage is present or not in a battery case of the sealed battery based on a change in the voltage measured by the measurement means.

In this aspect, the inspection device may further include output means for outputting at least one of a change in the voltage of the sealed battery measured by the measurement means and a result of the determination made by the determination means.

Advantageous Effects of Invention

According to the present invention, it is possible to provide a sealed battery manufacturing method and an inspection method which are capable of accurately determining damage to a battery case of a sealed battery by a simple technique.

BRIEF DESCRIPTION OF DRAWINGS

FIG. 4 is a table showing a relationship among a charging current to be supplied to the sealed battery, a supply time (0.5 seconds) for supplying the charging current, and the depth of a detectable recess in the battery case;

Figure 7A:
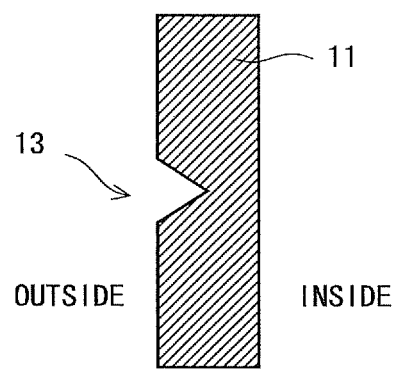
Figure 7B:
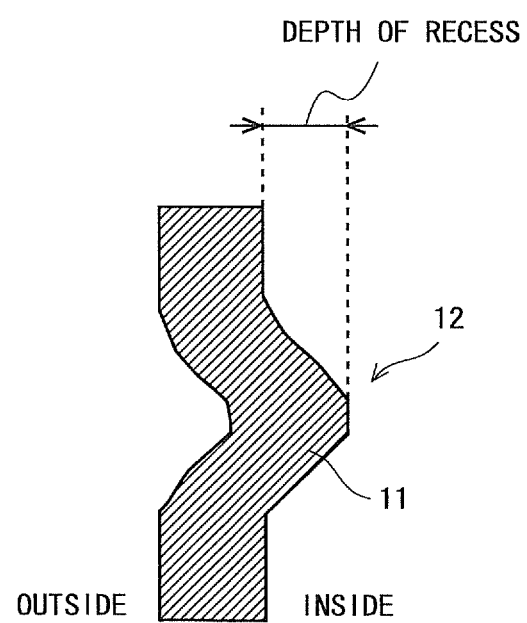

FIG. 5 is a table showing a relationship among a charging current (20 C) to be supplied to the sealed battery, a supply time of the charging current, and the depth of a detectable recess in the battery case of the sealed battery;

FIG. 6 is a table showing results of determination as to whether a recess is present or not in a battery case of a sealed battery having a capacity of 5 Ah and in a battery case of a sealed battery having a capacity of 25 Ah;

FIG. 7a is a diagram showing an example of a simple scratch which involves no deformation of the battery case; and FIG. 7b is a diagram showing an example of a recess which involves deformation of the battery case.

DESCRIPTION OF EMBODIMENTS

An embodiment of the present invention will be described below with reference to the drawings. In the process of manufacturing a sealed battery, such as a lithium ion secondary battery to be mounted on a vehicle, a mobile terminal, or the like, a damage inspection for a metallic battery case in which battery elements are accommodated is carried out. Among different types of damage to a battery case 11, it is especially important to discriminate a recess 12 (FIG. 7B), which involves deformation of the battery case 11, from a simple scratch 13 (FIG. 7A) which involves no deformation of the battery case 11. This is because when the recess 12 is generated in the battery case 11, the recess 12 itself has a large effect on the battery performance, unlike the simple scratch 13.

For example, when the recess 12 is generated in the battery case 11, the battery internal behavior locally changes, which may result in deterioration of the battery performance. This is caused due to a local change in which, when a part of the recess 12 in the battery case 11 approaches an electrode, the Li deposition resistance only in the approaching part improves, whereas the Li deposition resistance in the other peripheral parts thereof deteriorates.

Accordingly, a sealed battery manufacturing method according to an embodiment of the present invention accurately determines the recess 12 in the battery case 11 during the sealed battery manufacturing process, while discriminating the recess 12 from the simple scratch 13, thereby making it possible to accurately determine whether the battery case 11 is defective or non-defective. Consequently, many advantageous effects, such as an improvement in the reliability of the sealed battery and an improvement in the productivity of the sealed battery, can be expected.

Figure 1:
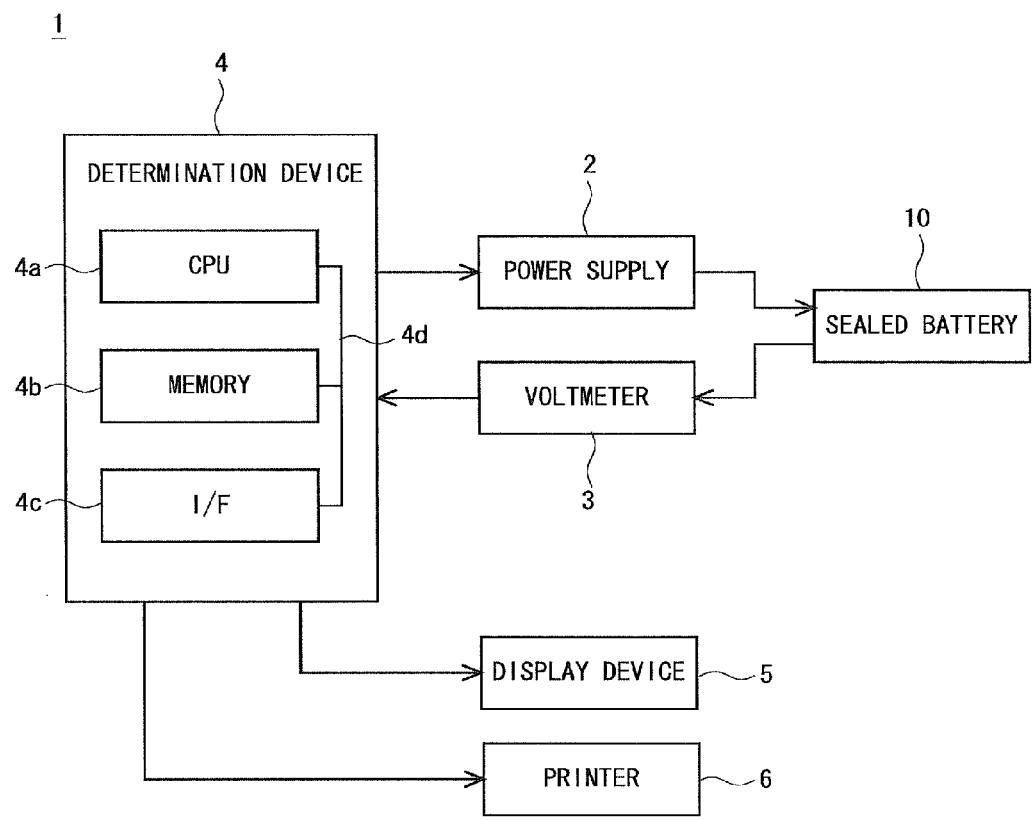
FIG. 1 is a block diagram showing a schematic system configuration of an inspection device according to an embodiment of the present invention.

Next, an inspection device according to an embodiment of the present invention, which is capable of accurately determining whether the battery case 11 is defective or non-defective, will be described in detail. FIG. 1 is a block diagram showing a schematic system configuration of the inspection device according to an embodiment of the present invention.

An inspection device 1 according to this embodiment includes a power supply 2 that supplies a current to a sealed battery 10, a voltmeter 3 that measures the voltage of the sealed battery 10, a determination device 4 that determines whether the sealed battery 10 is defective or non-defective, and a display device 5 and a printer 6 which output determination results and the like.

The power supply 2 is connected to each of the sealed battery 10 and the determination device 4, and supplies a charging current of a predetermined value to the sealed battery 10 according to a control signal from the determination device 4.

The voltmeter 3 is a specific example of measurement means and is connected to each of the sealed battery 10 and the determination device 4. The voltmeter 3 measures the voltage value of the sealed battery 10 and outputs the measured voltage value to the determination device 4.

The determination device 4 is a specific example of determination means, and accurately determines the recess 12 in the battery case 11, while distinguishing the recess 12 from the simple scratch 13 based on a change in the voltage of the sealed battery 10 measured by the voltmeter 3. Further, the determination device 4 can determine whether the battery case 11 of the sealed battery 10 is defective or non-defective based on the result of the determination on the recess 12.

For example, when the inclination of the voltage of the sealed battery 10 increases in a time variation of the voltage of the sealed battery 10 measured by the voltmeter 3, the determination device 4 determines that the recess 12 is present in the battery case 11 of the sealed battery 10, and thus determines that the battery case 11 of the sealed battery 10 is defective. More specifically, when the inclination of the voltage during a first measurement period is smaller than the inclination of the voltage during a second measurement period, which is subsequent to the first measurement period, in a time variation of the voltage of the sealed battery 10 measured by the voltmeter 3, the determination device 4 determines that the recess 12 is present in the battery case 11 of the sealed battery 10, and thus determines that the battery case 11 of the sealed battery 10 is defective.

For example, the determination device 4 has a hardware configuration based on a microcomputer including: a CPU (Central Processing Unit) 4a that performs arithmetic processing, control processing, and the like; a memory 4b that is composed of a ROM (Read Only Memory) and a RAM (Random Access Memory) and stores an operation program, a control program, and the like which are executed by the CPU 4a; and an interface unit (I/F) 4c that receives and outputs signals from and to the outside. The CPU 4a, the memory 4b, and the interface unit 4c are connected to each other via a data bus 4d or the like.

The display device 5 and the printer 6 are specific examples of output means, and output, to a user, a time change of the voltage of the sealed battery 10 measured by the voltmeter 3, and determination results of the determination device 4, i.e., a result of the determination as to whether the recess 12 is present or not in the battery case 11 of the sealed battery 10 and a result of the determination as to whether the battery case 11 is defective or non-defective. The display device 5 is composed of, for example, a liquid crystal display device or an organic EL display device.

Figure 2:
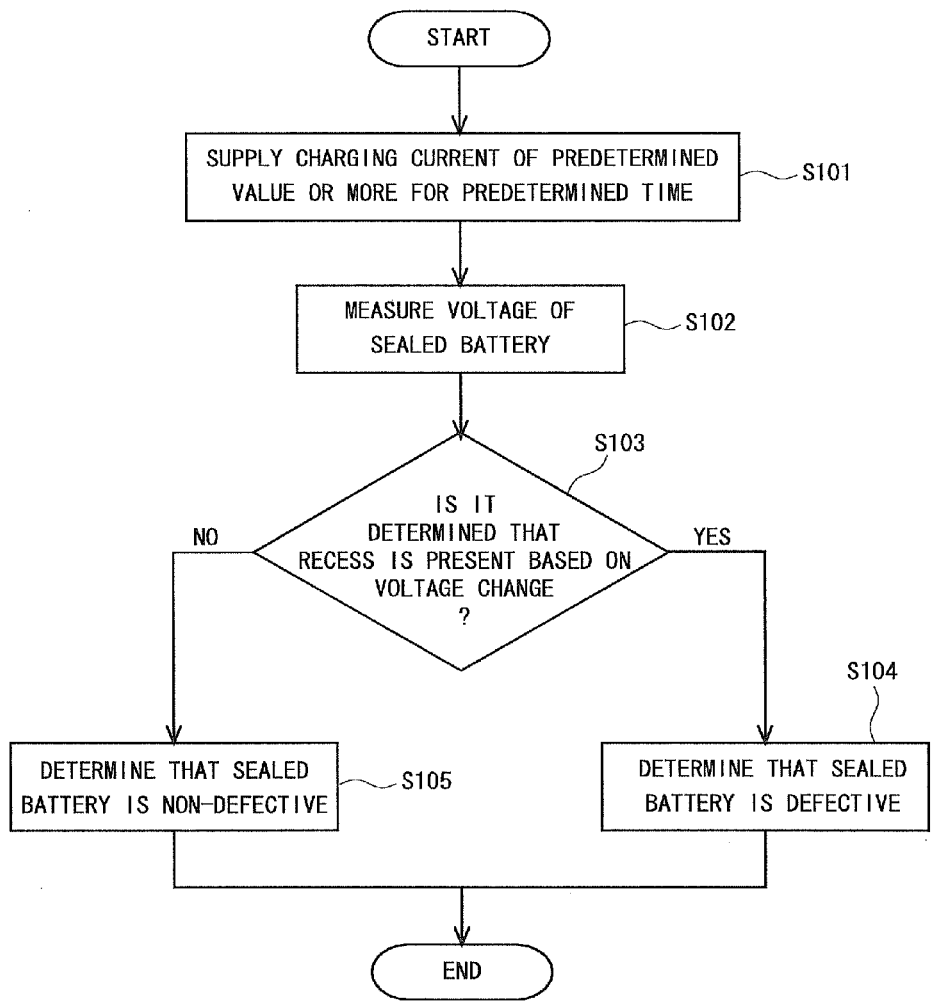
FIG. 2 is a flowchart showing an inspection flow of the inspection device in a sealed battery manufacturing method according to an embodiment of the present invention.

Next, an inspection method of the inspection device 1 in the method for manufacturing the sealed battery 10 according to this embodiment will be described in detail. FIG. 2 is a flowchart showing an inspection flow of the inspection device in the sealed battery manufacturing method.

First, the determination device 4 causes a high-rate charging current of a predetermined value or more to be supplied from the power supply 2 to the sealed battery 10 for a predetermined time (for a small number of seconds) after an aging process and after initial charging (step S101). Note that the determination device 4 may cause the high-rate charging current of the predetermined value or more to be supplied from the power supply 2 to the sealed battery 10 for the predetermined time before the aging process and after the initial charging. Thus, the determination device 4 may cause the charging current to be supplied in any process after the initial charging.

The voltmeter 3 measures the voltage of the sealed battery 10, and outputs the measured voltage value of the sealed battery 10 to the determination device 4 (step S102).

The determination device 4 determines whether the recess 12 is present or not in the battery case 11 of the sealed battery 10 based on a change in the voltage of the sealed battery 10 measured by the voltmeter 3 (step S103), thereby determining whether the battery case 11 of the sealed battery 10 is defective or non-defective based on the presence or absence of the recess 12.

When the determination device 4 determines that the recess 12 is present in the battery case 11 of the sealed battery 10 based on a change in the voltage of the sealed battery 10 measured by the voltmeter 3 (YES in step S103), the determination device 4 determines that the battery case 11 of the sealed battery 10 is defective (step S104). On the other hand, when the determination device 4 determines that the recess 12 is not present in the battery case 11 of the sealed battery 10 based on a change in the voltage of the sealed battery 10 measured by the voltmeter 3 (NO in step S103), the determination device 4 determines that the battery case 11 of the sealed battery 10 is non-defective (step S105).

Next, the method in which the determination device 4 determines whether the recess 12 is present or not in the battery case 11 of the sealed battery 10 based on a change in the voltage of the sealed battery 10 measured by the voltmeter 3 will be described in detail.

Figure 3:
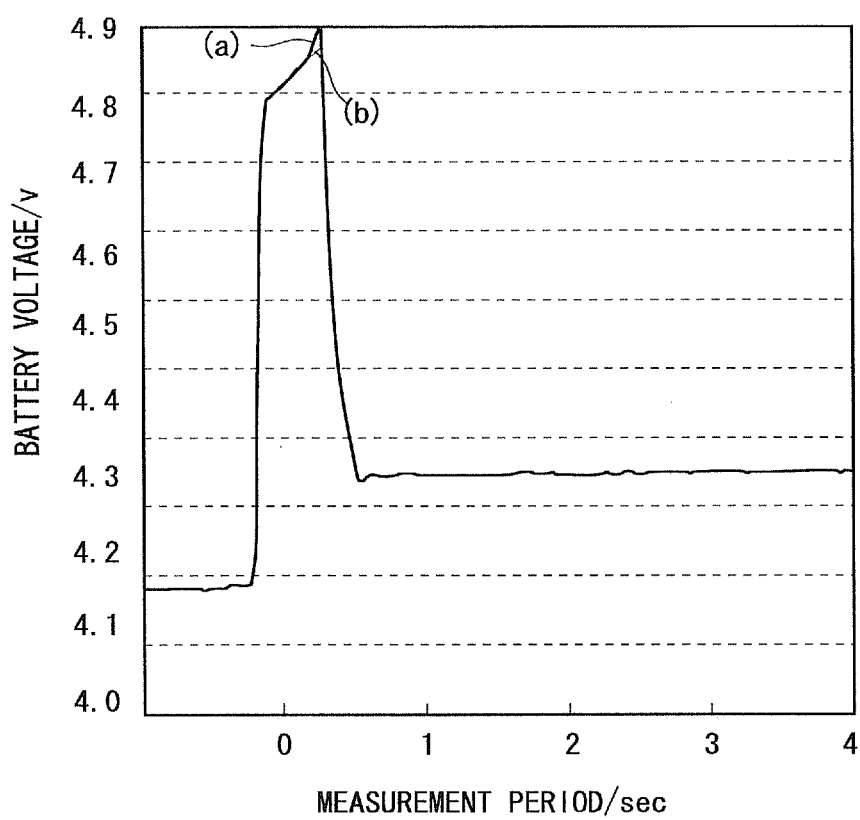
FIG. 3 is a graph showing a result of a comparison between the case where a recess is present in a battery case and the case where a recess is not present in the battery case, based on a change in the voltage of the sealed battery.

FIG. 3 is a graph showing a result of a comparison between the case where the recess is present in the battery case and the case where the recess is not present in the battery case, based on a change in the voltage of the sealed battery. Referring to FIG. 3, a change in the voltage of the sealed battery 10 is measured by, for example, causing a charging current of 20 C to flow to the sealed battery 10 only for 0.5 seconds. The sealed battery 10 is, for example, a rectangular battery having a substantially rectangular parallelepiped shape.

As shown in FIG. 3, in the case (a) where the recess 12 is present in the battery case 11 of the sealed battery 10, the inclination of the voltage of the sealed battery 10 increases as compared to the case (b) where the recess 12 is not present in the battery case 11 of the sealed battery 10. For example, the inclination of the voltage of the sealed battery 10 during the second measurement period of 0.3 to 0.5 seconds is larger than the inclination of the voltage of the sealed battery 10 during the first measurement period of 0.0 to 0.3 seconds.

As described above, when the inclination of the voltage of the sealed battery 10 increases in the time change of the voltage of the sealed battery 10 measured by the voltmeter 3, the determination device 4 determines that the recess 12 is present in the battery case 11 of the sealed battery 10.

For example, the voltmeter 3 measures the voltage of the seal type battery 10 when the charging current of 20 C is caused to flow to the sealed battery 10 for 0.5 seconds. Then, when the inclination of the voltage of the sealed battery 10 during the second measurement period of 0.3 to 0.5 seconds is larger than the inclination of the voltage of the sealed battery 10 during the first measurement period of 0.0 to 0.3 seconds in the time change of the voltage of the sealed battery 10 measured by the voltmeter 3, the determination device 4 determines that the recess 12 is present in the battery case 11 of the sealed battery 10.

Note that the determination device 4 may output a graph or the like, which represents the relationship between the time and the voltage of the sealed battery 10 as shown in FIG. 3, to the display device (a liquid crystal display device, an organic EL display device, etc.) 5, the printer 6, and the like. Further, the user may determine whether the recess 12 is present or not in the battery case 11 of the sealed battery 10 based on the relationship between the time and the change in the voltage of the sealed battery 10, which is output to the display device 5 and the printer 6.

Next, a method for setting the value of the charging current, which is supplied from the power supply 2 to the sealed battery 10, and the supply time of the charging current in the above-mentioned step (step S101) will be described.

First, the case where the supply time of the charging current to be supplied to the sealed battery 10 is fixed to 0.5 seconds and the charging current is gradually increased to 10 C, 15 C, 20 C, and 25 C will be described. FIG. 4 is a table showing the relationship among the charging current to be supplied to the sealed battery, the supply time (for 0.5 seconds), and the depth of a detectable recess in the battery case.

In FIG. 4 and FIGS. 5 and 6 described later, "○" represents the case where the recess 12 can be detected on the battery case 11 of the sealed battery 10, and "x" represents the case where the recess 12 cannot be detected on the battery case 11 of the sealed battery 10. The depth of the recess 12 is, for example, the distance from the inner surface of the battery case 11 of the sealed battery 10 to the innermost tip of the recess 12 as shown in FIG. 7B.

FIG. 4 shows that when the charging current to be supplied to the sealed battery 10 is 20 C or more (20 C and 25 C), the recesses 12 each having a depth of 0.050 mm or more, which have a relatively large effect on the battery performance, can be detected on the battery case 11 of the sealed battery 10.

As the charging current to be supplied to the sealed battery 10 is further increased, the inclination of the voltage of the sealed battery 10 increases and the recess 12 can be more clearly detected on the battery case 11 of the sealed battery 10. However, in consideration of damage to the sealed battery 10, it is not appropriate to further increase the charging current.

As is apparent from the above results, it is preferable that the charging current to be supplied to the sealed battery 10 be set to 20 to 25 C, and it is most preferable to set the charging current to 20 C, in view of the accuracy of determination as to whether the recess 12 is present or not in the battery case 11 of the sealed battery 10 and the safety of the sealed battery 10. The set values 20 C and 25 C (critical values) of the charging current are not strictly limited to the above-mentioned set values. The values may be set with a certain degree of freedom within a range in which the same operation and effect of the invention can be obtained and within an acceptable error range.

Next, the case where the charging current to be supplied to the sealed battery 10 is fixed to 20 C and the supply time is gradually increased to 0.1 seconds, 0.5 seconds, 1.0 seconds, and 2.0 seconds will be described. FIG. 5 is a table showing the relationship among the charging current (20 C) to be supplied to the sealed battery, the supply time, and the depth of the detectable recess 12 in the battery case 11 of the sealed battery 10.

FIG. 5 shows that when the supply time of the charging current to be supplied to the sealed battery 10 is 0.5 to 1.0 seconds, the recesses 12 each having a depth of 0.05 mm or more, which have a relatively large effect on the battery performance, can be detected on the battery case 11 of the sealed battery 10.

However, in consideration of damage to the sealed battery 10, it is preferable to reduce the supply time of the charging current. Further, when the supply time of the charging current to be supplied to the sealed battery 10 is 2.0 seconds, a current distribution is generated, which deteriorates the accuracy of detecting the recess 12. Accordingly, the depth of the detectable recess 12 is 0.075 mm or more.

As is apparent from the above results, it is preferable that the supply time of the charging current to be supplied to the sealed battery 10 be set to 0.5 to 1.0 seconds, and it is most preferable to set the supply time to 0.5 seconds, in consideration of the accuracy of determination as to whether the recess 12 is present or not in the battery case 11 of the sealed battery 10 and the safety of the sealed battery 10. The set supply time of 0.5 seconds and 1.0 seconds (critical values) of the charging current is not strictly limited to the above-mentioned set values. The supply time may be set with a certain degree of freedom within a range in which the same operation and effect of the invention can be obtained and within an acceptable error range.

As is apparent from the above results shown in FIGS. 4 and 5, it is preferable to measure a time change of the voltage of the sealed battery 10 when a charging current of 20 to 25 C is caused to flow to the sealed battery 10 for a supply time of 0.5 to 1.0 seconds and to determine whether the recess 12 is present or not in the battery case 11 of the sealed battery 10 based on the inclination of the voltage. Further, it is most preferable to measure a time change of the voltage of the sealed battery 10 when the charging current of 20 C is caused to flow to the sealed battery 10 for a supply time of 0.5 seconds and to determine whether the recess 12 is present or not in the battery case 11 of the sealed battery 10 based on the inclination of the voltage.

Next, the case of determining the recess 12 in the battery case 11 of each of the sealed batteries 10 having different capacities will be described in detail. FIG. 6 is a table showing results of determination as to whether the recess is present or not in the battery case of the sealed battery having a capacity of 5 Ah and in the battery case of the sealed battery having a capacity of 25 Ah. As shown in FIG. 6, it is determined whether the recess 12 is present or not in the battery cases 11 of the sealed batteries 10 when the charging current of 20 C is caused to flow to each of the sealed batteries 10 having different capacities for the supply time of 0.5 seconds.

FIG. 6 shows that the recess 12 having a depth of 0.050 mm or more can be detected on both of the battery cases 11 of the sealed battery 10 having a capacity of 5 Ah and the sealed battery 10 having a capacity of 25 Ah. An example in which the sealed batteries having the capacities of 5 Ah and 25 Ah, respectively, are used as the sealed batteries 10 having different capacities has been described above. However, the sealed batteries are not limited thereto. For example, the same operation and effect can also be obtained by using the sealed batteries 10 having a capacity in the range of 1 to 50 Ah. In other words, the above-described recess detecting method is also effective for the sealed batteries 10 of any capacity.

As described above, in the method for manufacturing the sealed battery 10 according to this embodiment, the voltage of the sealed battery 10 is measured when a charging current of a predetermined value or more is caused to flow to the sealed battery 10 for a predetermined time after the initial charging, and when the inclination of the voltage increases in a time change of the measured voltage, it is determined that the recess 12 is present in the battery case 11 of the sealed battery 10. This method accurately determines the recess 12 in the battery case 11, while discriminating the recess 12 from the simple scratch 13, in the process of manufacturing the sealed battery 10, thereby making it possible to accurately determine whether the battery case 11 is defective or non-defective. Furthermore, whether the battery case 11 is defective or non-defective can be accurately determined merely by causing a high-rate charging current to flow to the sealed battery 10 for a small number of seconds after the initial charging and by measuring a change in the voltage of the sealed battery 10, without using any special measuring device or the like. That is, it is possible to accurately determine damage to the battery case 11 of the sealed battery 10 by a simple method.

The present invention is not limited to the above embodiment, and can be modified as appropriate without departing from the scope of the invention. For example, a lithium ion secondary battery is used as the sealed battery 10 in the above embodiment, but the sealed battery 10 is not limited thereto. Any sealed battery, such as a nickel hydrogen storage battery, a lead storage battery, a lithium-ion polymer secondary battery, a nickel-cadmium storage battery, a nickel-iron storage battery, a nickel-zinc storage battery, or a zinc-silver oxide storage battery, can be used as the sealed battery 10. Further, a rectangular battery having a substantially rectangular parallelepiped shape is used as the sealed battery 10, but the sealed battery 10 is not limited thereto. Sealed batteries of any shape, such as a round battery, can be used.

In the above embodiment, the process shown in FIG. 2 can also be implemented by, for example, causing the CPU 4a to execute a computer program. In this case, the computer program can be stored and provided in a recording medium, or can be provided by transferring the computer program via the Internet or other communication media.

Examples of the storage medium include a floppy disk, a hard disk, a magnetic disk, a magneto-optical disk, a CD-ROM, a DVD, a ROM cartridge, a RAM memory cartridge with battery backup, a flash memory cartridge, and a nonvolatile RAM cartridge. Examples of the communication media include wired communication media, such as telephone lines, and wireless communication media, such as microwave lines.

This application is based upon and claims the benefit of priority from Japanese patent application No. 2012-212596, filed on Sep. 26, 2012, the disclosure of which is incorporated herein in its entirety by reference.

REFERENCE SIGNS LIST

1 INSPECTION DEVICE
2 POWER SUPPLY
3 VOLTMETER
4 DETERMINATION DEVICE
5 DISPLAY DEVICE
6 PRINTER
10 SEALED BATTERY
11 BATTERY CASE
12 RECESS
13 SCRATCH

The invention claimed is:

1. A sealed battery manufacturing method comprising the steps of:
    measuring a voltage of the sealed battery when a charging current of a predetermined value or more is caused to flow to the sealed battery for a predetermined time after initial charging of the sealed battery; and
    determining whether a recess is present or not in a battery case of the sealed battery based on an inclination of the voltage in a time change of the measured voltage;
    wherein when the inclination of the voltage during a first measurement period is smaller than the inclination of the voltage during a second measurement period subsequent to the first measurement period in the time change of the measured voltage, it is determined that the recess is present in the battery case of the sealed battery.

2. The sealed battery manufacturing method according to claim 1, wherein the voltage of the sealed battery is measured when a charging current of 20 to 25 C is caused to flow to the sealed battery for 0.5 to 1.0 seconds after the initial charging.

3. The sealed battery manufacturing method according to claim 1, wherein the voltage of the sealed battery is measured when a charging current of 20 C is caused to flow to the sealed battery for 0.5 seconds after the initial charging.

4. The sealed battery manufacturing method according to claim 3, wherein when the inclination of the voltage during a measurement period of 0.3 to 0.5 seconds is larger than the inclination of the voltage during a measurement period of 0.0 to 0.3 seconds in the time change of the measured voltage, it is determined that the recess is present in the battery case of the sealed battery.

5. The sealed battery manufacturing method according to claim 1, wherein the sealed battery is a rectangular lithium ion battery.

6. An inspection device comprising:
measurement means for measuring a voltage of a sealed battery when a charging current of a predetermined value or more is caused to flow to the sealed battery for a predetermined time after initial charging of the sealed battery; and
determination means for determining whether a recess is present or not in a battery case of the sealed battery based on an inclination of the voltage in a time change of the voltage measured by the measurement means;
wherein when the inclination of the voltage during a first measurement period is smaller than the inclination of the voltage during a second measurement period subsequent to the first measurement period in the time change of the measured voltage, it is determined that the recess is present in the battery case of the sealed battery.

7. The inspection device according to claim 6, further comprising output means for outputting at least one of a change in the voltage of the sealed battery measured by the measurement means and a result of the determination made by the determination means.

8. A sealed battery manufacturing method comprising the steps of:
measuring a voltage of the sealed battery when a charging current of a predetermined value or more is caused to flow to the sealed battery for a predetermined time after initial charging of the sealed battery; and
determining whether a recess is present or not in a battery case of the sealed battery based on an inclination of the voltage in a time change of the measured voltage;
wherein the voltage of the sealed battery is measured when a charging current of 20 to 25 C is caused to flow to the sealed battery for 0.5 to 1.0 seconds after the initial charging.

9. The sealed battery manufacturing method according to claim 8, wherein the voltage of the sealed battery is measured when a charging current of 20 C is caused to flow to the sealed battery for 0.5 seconds after the initial charging.

10. The sealed battery manufacturing method according to claim 9, wherein when the inclination of the voltage during a measurement period of 0.3 to 0.5 seconds is larger than the inclination of the voltage during a measurement period of 0.0 to 0.3 seconds in the time change of the measured voltage, it is determined that the recess is present in the battery case of the sealed battery.

* * * * *